United States Patent
Kuroiwa

(12) 
(10) Patent No.: US 9,025,943 B2
(45) Date of Patent: May 5, 2015

(54) HEAT TREATMENT APPARATUS AND HEAT TREATMENT METHOD FOR HEATING SUBSTRATE BY IRRADIATING SUBSTRATE WITH FLASHES OF LIGHT

(75) Inventor: Toru Kuroiwa, Kyoto (JP)

(73) Assignee: Screen Holdings Co., Ltd. (JP)

( * ) Notice: Subject to any disclaimer, the term of this patent is extended or adjusted under 35 U.S.C. 154(b) by 415 days.

(21) Appl. No.: 13/177,705

(22) Filed: Jul. 7, 2011

(65) Prior Publication Data

US 2012/0076477 A1    Mar. 29, 2012

(30) Foreign Application Priority Data

Sep. 28, 2010 (JP) ................. 2010-216393

(51) Int. Cl.
| | | |
|---|---|---|
| G01J 5/10 | (2006.01) | |
| G01J 5/28 | (2006.01) | |
| F27B 5/18 | (2006.01) | |
| F27D 19/00 | (2006.01) | |
| F27B 17/00 | (2006.01) | |
| G01J 5/02 | (2006.01) | |

(Continued)

(52) U.S. Cl.
CPC ..... F27B 17/0025 (2013.01); F27D 2019/0003 (2013.01); F27B 5/18 (2013.01); G01J 5/026 (2013.01); G01J 5/0007 (2013.01); H01L 21/67115 (2013.01); H01L 21/67248 (2013.01)

(58) Field of Classification Search
CPC ......... G01J 5/0003; G01J 5/0007; G01J 5/10; G01J 5/20; G01J 5/26; G01J 5/28; G01J 5/32; H01L 21/67115; H01L 21/6719; H01L 21/68792; F27B 17/0025; F27B 5/18; F27D 11/12

See application file for complete search history.

(56) References Cited

U.S. PATENT DOCUMENTS

| | | | |
|---|---|---|---|
| 4,859,832 A | | 8/1989 | Uehara et al. |
| 5,501,637 A | * | 3/1996 | Duncan et al. ............... 374/126 |
| 6,056,434 A | | 5/2000 | Champetier |

(Continued)

FOREIGN PATENT DOCUMENTS

| | | |
|---|---|---|
| JP | S63-188940 | 8/1988 |
| JP | H11-316159 | 11/1999 |

(Continued)

OTHER PUBLICATIONS

Japanese Office Action mailed Apr. 8, 2014 in connection with corresponding Japanese Patent Application No. 2010-216393 and English translation thereof.

(Continued)

*Primary Examiner* — Joseph M Pelham
(74) *Attorney, Agent, or Firm* — Ostrolenk Faber LLP

(57) ABSTRACT

Radiant energy from a semiconductor wafer which is determined from the theoretical value of black body radiation and the actually measured result of an output from a photodiode are brought into correspondence with each other, and a table showing a correlation therebetween is acquired and stored on a magnetic disk. When a semiconductor wafer to be treated is irradiated with flashes of light from flash lamps, the photodiode receives radiant light emitted from the semiconductor wafer. A controller determines, from the output from the photodiode, the radiant energy emitted per unit time from the semiconductor wafer irradiated with flashes of light, based on the acquired table. The controller further determines the surface temperature of the semiconductor wafer from the determined radiant energy.

1 Claim, 11 Drawing Sheets

(51) Int. Cl.
*G01J 5/00* (2006.01)
*H01L 21/67* (2006.01)

(56) References Cited

U.S. PATENT DOCUMENTS

| | | | |
|---|---|---|---|
| 6,885,815 B2* | 4/2005 | Kusuda et al. | 392/416 |
| 7,115,837 B2* | 10/2006 | Timans et al. | 219/405 |
| 7,317,870 B2* | 1/2008 | Timans et al. | 392/416 |
| 7,445,382 B2* | 11/2008 | Camm et al. | 374/121 |
| 7,616,872 B2* | 11/2009 | Camm et al. | 392/416 |
| 7,758,238 B2* | 7/2010 | Govindaraju et al. | 374/123 |
| 8,005,351 B2* | 8/2011 | Camm et al. | 392/416 |
| 2003/0095818 A1 | 5/2003 | Nakayama | |
| 2003/0183612 A1 | 10/2003 | Timans et al. | |
| 2004/0008980 A1* | 1/2004 | Morimoto et al. | 392/418 |
| 2004/0079746 A1* | 4/2004 | Jennings et al. | 219/390 |
| 2004/0149715 A1 | 8/2004 | Timans et al. | |
| 2005/0023267 A1 | 2/2005 | Timans et al. | |
| 2005/0063448 A1 | 3/2005 | Kusuda | |
| 2005/0063453 A1* | 3/2005 | Camm et al. | 374/161 |
| 2005/0236395 A1 | 10/2005 | Timans et al. | |
| 2005/0244199 A1 | 11/2005 | Nakayama | |
| 2006/0096677 A1* | 5/2006 | Camm et al. | 148/565 |
| 2007/0069161 A1* | 3/2007 | Camm et al. | 250/504 R |
| 2007/0131671 A1 | 6/2007 | Timans et al. | |
| 2007/0189359 A1* | 8/2007 | Chen et al. | 374/161 |
| 2008/0069550 A1* | 3/2008 | Timans et al. | 392/411 |
| 2008/0273867 A1* | 11/2008 | Camm et al. | 392/416 |
| 2009/0285568 A1 | 11/2009 | Kiyama et al. | |
| 2009/0323759 A1* | 12/2009 | Govindaraju et al. | 374/123 |
| 2010/0219174 A1 | 9/2010 | Timans et al. | |
| 2011/0236844 A1 | 9/2011 | Timans et al. | |
| 2011/0274417 A1* | 11/2011 | Camm et al. | 392/411 |
| 2012/0076476 A1* | 3/2012 | Kusuda et al. | 392/416 |
| 2012/0208377 A1* | 8/2012 | Timans | 438/799 |
| 2012/0288261 A1* | 11/2012 | Hashimoto et al. | 392/416 |

FOREIGN PATENT DOCUMENTS

| | | |
|---|---|---|
| JP | 2003-186322 | 7/2003 |
| JP | 2004-186300 | 7/2004 |
| JP | 2005-093750 | 3/2005 |
| JP | 2005-515425 | 5/2005 |
| JP | 2005-527972 | 9/2005 |
| JP | 2006-170616 | 6/2006 |
| JP | 2007-500447 | 1/2007 |
| JP | 2008-185482 | 8/2008 |
| JP | 2009-508337 | 2/2009 |
| JP | 2009-277759 | 11/2009 |
| JP | 2010-114293 | 5/2010 |
| WO | WO 02/075264 | 9/2002 |
| WO | WO 03/060447 | 7/2003 |

OTHER PUBLICATIONS

Office Action issued by Japanese Patent Office on Nov. 4, 2014 in connection with corresponding Japanese Patent Application No. JP 2010-216393 and English Translation thereof.

* cited by examiner

FIG. 1
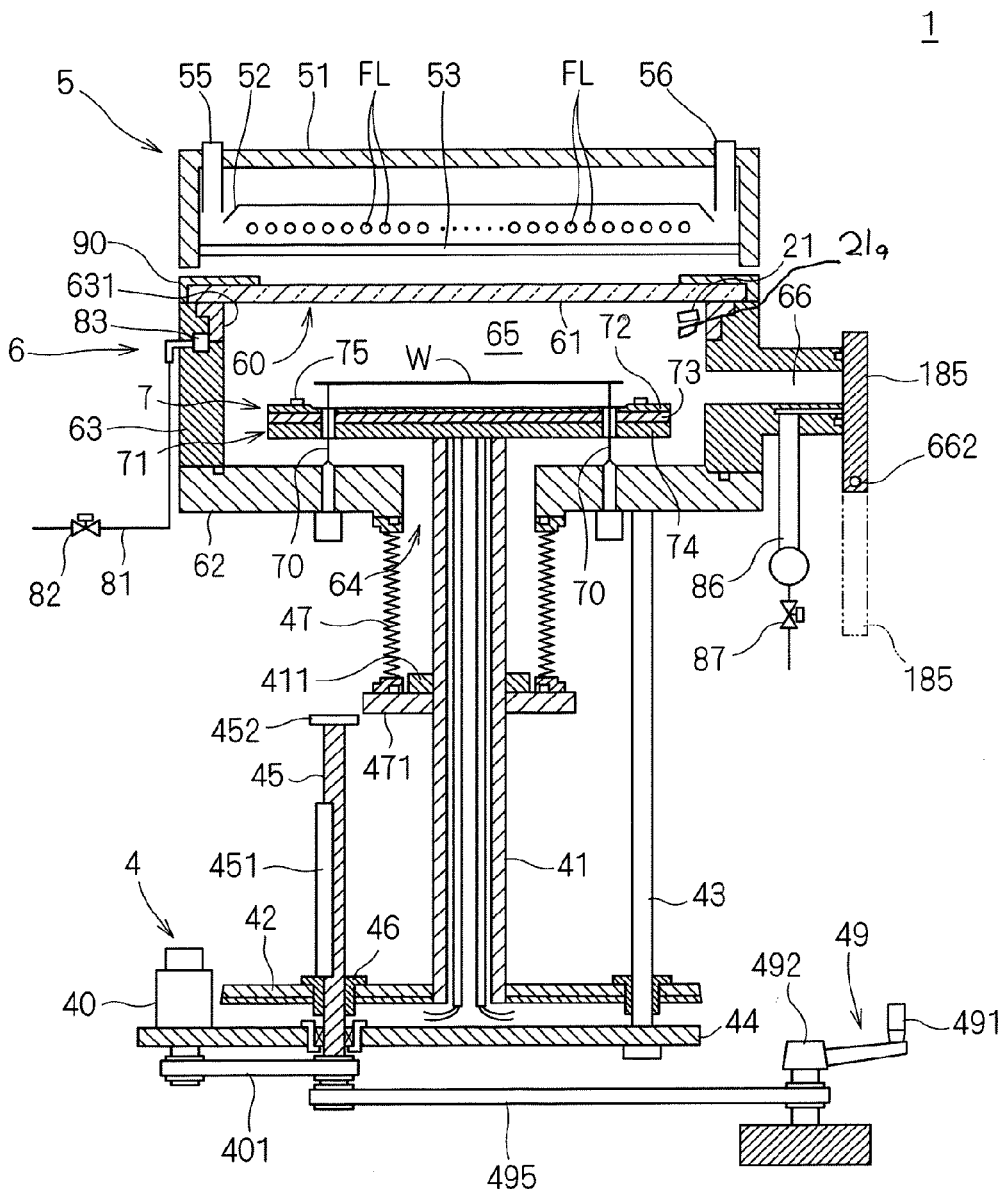
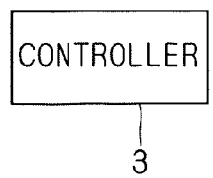

F I G . 2
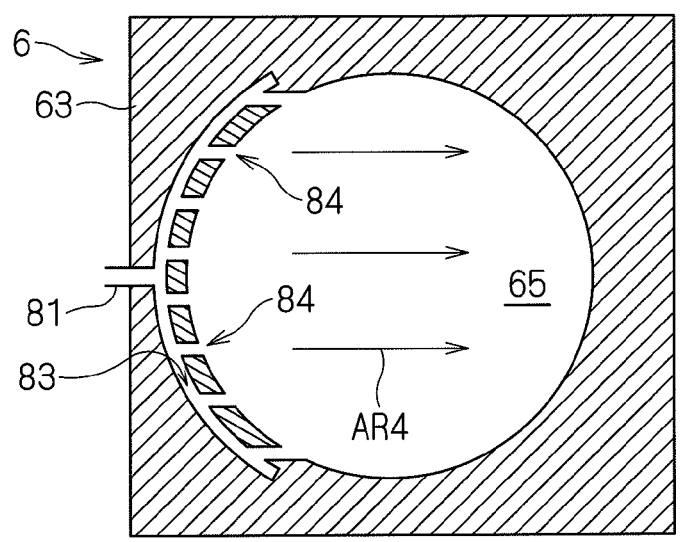

F I G . 3
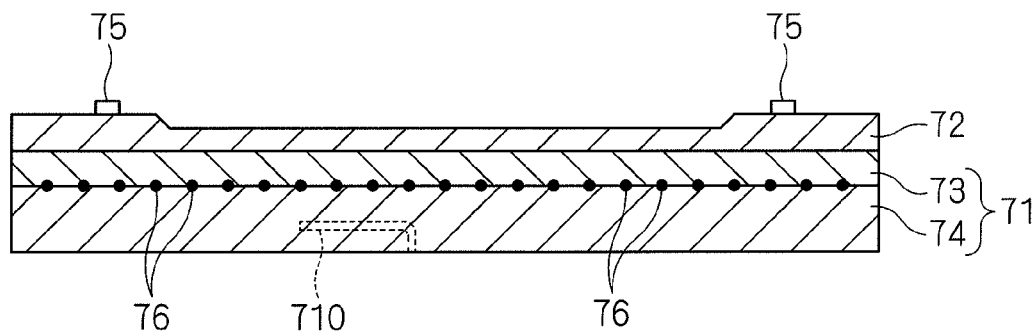

F I G . 4
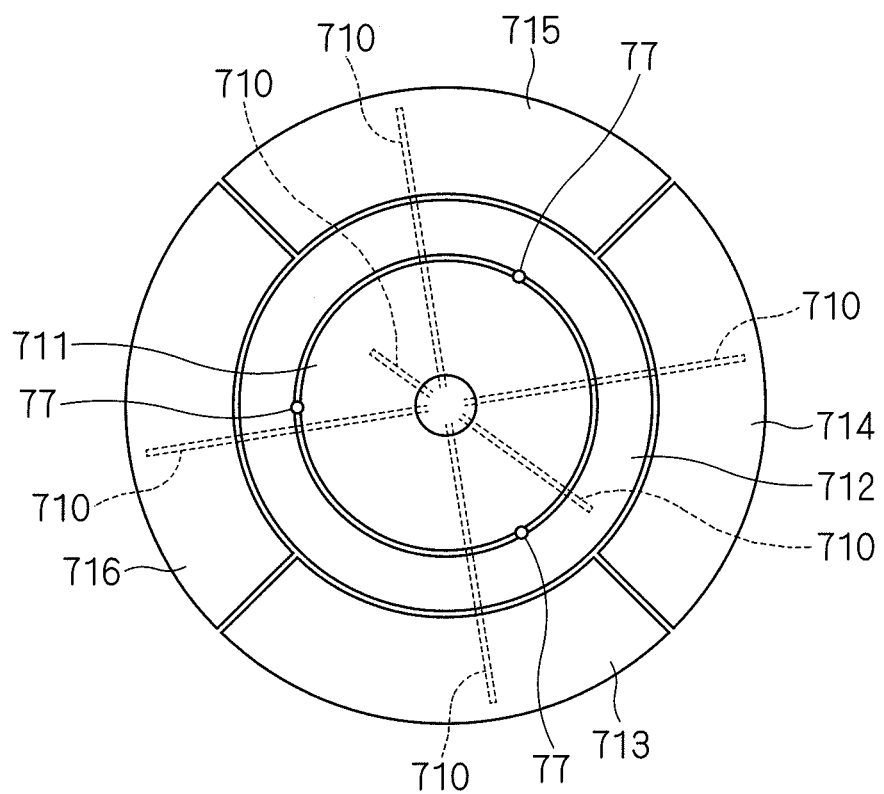

F I G . 9
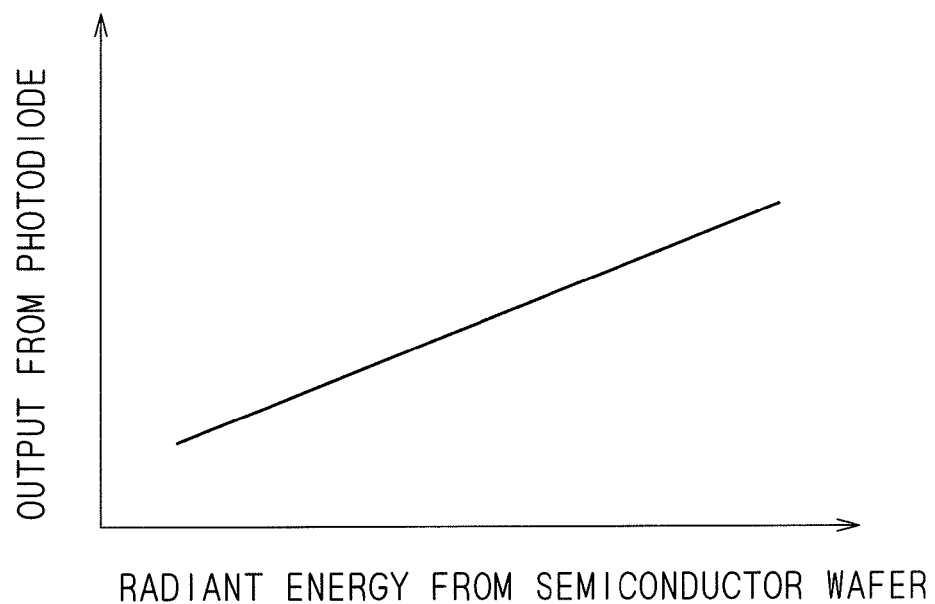

F I G. 1 1
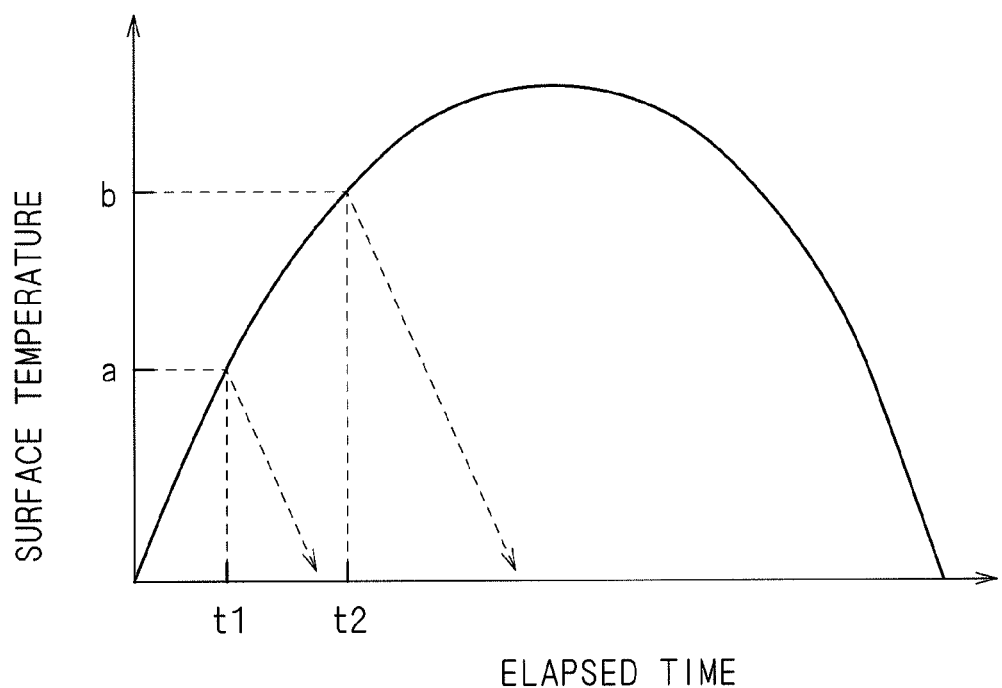

HEAT TREATMENT APPARATUS AND HEAT TREATMENT METHOD FOR HEATING SUBSTRATE BY IRRADIATING SUBSTRATE WITH FLASHES OF LIGHT

BACKGROUND OF THE INVENTION

1. Field of the Invention

The present invention relates to a heat treatment apparatus and a heat treatment method for heating a thin plate-like precision electronic substrate such as a semiconductor wafer and a glass substrate for a liquid crystal display device (hereinafter referred to simply as a "substrate") by irradiating the substrate with flashes of light.

2. Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might present a problem in good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate the surface of a semiconductor wafer with flashes of light, thereby raising the temperature of only the surface of the semiconductor wafer doped with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with flashes of light emitted from the xenon flash lamps, the temperature of the semiconductor wafer can be raised rapidly, with only a small amount of light transmitted through the semiconductor wafer. Also, it has turned out that the irradiation of a semiconductor wafer with flashes of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

U.S. Patent Application Publication No. US-2005-0063448-A1 discloses a technique in which a light measuring part in a flash lamp annealer includes a calorimeter disposed outside a chamber body, a light guide structure for guiding light emitted inside the chamber body to the calorimeter, and a calculating part for performing computations on the basis of an output from the calorimeter, the light measuring part being adapted to measure the energy of light emitted from flash lamps inside the chamber body by means of the calorimeter. U.S. Patent Application Publication No. US-2005-0063448-A1 also discloses a technique in which the surface temperature of a substrate is obtained by computations, based on the energy of flashes of light measured by means of the calorimeter.

The technique disclosed in U.S. Patent Application Publication No. US-2005-0063448-A1 presents the process of measuring the total energy (the total amount of heat) of a single flash of light to thereby determine the maximum temperature achieved at the surface of the substrate from the total energy ex post facto (i.e., after the irradiation of the substrate with flashes of light). In other words, the technique disclosed in U.S. Patent Application Publication No. US-2005-0063448-A1 is not capable of making real-time measurements of the surface temperature of the substrate which increases rapidly during the irradiation with flashes of light. Also, the technique disclosed in U.S. Patent Application Publication No. US-2005-0063448-A1, in which the temperature of the substrate surface is determined ex post facto after the irradiation with flashes of light, is not capable of controlling the irradiation of the substrate with flashes of light, based on the result of the measurements.

For high-precision flash lamp annealing, there is a need to make real-time measurements of the temperature of a substrate which increases during the irradiation with flashes of light. It is also desired that the irradiation of a substrate with flashes of light is controlled, based on the result of measurements of the temperature of the substrate.

SUMMARY OF THE INVENTION

The present invention is intended for a heat treatment apparatus for heating a substrate by irradiating the substrate with flashes of light.

According to one aspect of the present invention, the heat treatment apparatus comprises: a chamber for receiving a substrate; a holder for holding the substrate within the chamber; a flash lamp for irradiating the substrate held by the holder with flashes of light; a photodiode for receiving radiant light emitted from the substrate held by the holder; a storage part for storing a table showing a correlation between radiant energy per unit time from the substrate and an output from the photodiode; an energy calculating part for determining, from the output from the photodiode, the radiant energy emitted per unit time from the substrate irradiated with flashes of light from the flash lamp, based on the table; and a temperature determining part for determining the surface temperature of the substrate from the radiant energy per unit time from the substrate determined by the energy calculating part.

The table showing the correlation between the radiant energy per unit time from the substrate and the output from the photodiode is previously stored. Based on the table, the radiant energy emitted per unit time from the substrate irradiated with flashes of light from the flash lamp is determined from the output from the photodiode. Further, the surface temperature of the substrate is determined from the determined radiant energy per unit time from the substrate. During the irradiation with flashes of light, the radiant energy is hence determined by checking the output from the photodiode extremely short in response time against the table, whereby the surface temperature is determined. This allows real-time measurements of the surface temperature of the substrate during the irradiation with flashes of light.

Preferably, the flash lamp is a xenon flash lamp, and the photodiode has a measuring wavelength of not less than 3 μm.

This prevents the flashes of light emitted from the xenon flash lamp from serving as disturbance light.

The present invention is also intended for a method of heating a substrate by irradiating the substrate with flashes of light.

According to one aspect of the present invention, the method comprises the steps of: (a) acquiring a table showing a correlation between radiant energy per unit time from a substrate and an output from a photodiode receiving radiant light emitted from the substrate; (b) irradiating the substrate with flashes of light from a flash lamp; (c) determining, from the output from the photodiode, the radiant energy emitted per unit time from the substrate irradiated with flashes of light, based on the table; and (d) determining the surface temperature of the substrate from the radiant energy per unit time from the substrate determined in the step (c).

During the irradiation with flashes of light, the radiant energy is determined by checking the output from the photodiode extremely short in response time against the table, whereby the surface temperature is determined. This allows real-time measurements of the surface temperature of the substrate during the irradiation with flashes of light.

Preferably, the flash lamp is a xenon flash lamp, and the photodiode has a measuring wavelength of not less than 3 μm.

This prevents the flashes of light emitted from the xenon flash lamp from serving as disturbance light.

It is therefore an object of the present invention to make real-time measurements of the surface temperature of a substrate during the irradiation of the substrate with flashes of light.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal sectional view showing a configuration of a heat treatment apparatus according to the present invention;

FIG. 2 is a sectional view showing a gas passage in the heat treatment apparatus of FIG. 1;

FIG. 3 is a sectional view showing a configuration of a holder;

FIG. 4 is a plan view showing a hot plate;

FIG. 9 is a graph illustrating an example of a table showing a correlation between radiant energy per unit time from a semiconductor wafer and an output from a photodiode;

FIG. 11 is a graph showing changes in the surface temperature of a semiconductor wafer which are caused by controlling flashes of light.

DESCRIPTION OF THE PREFERRED EMBODIMENTS

Figure 5:
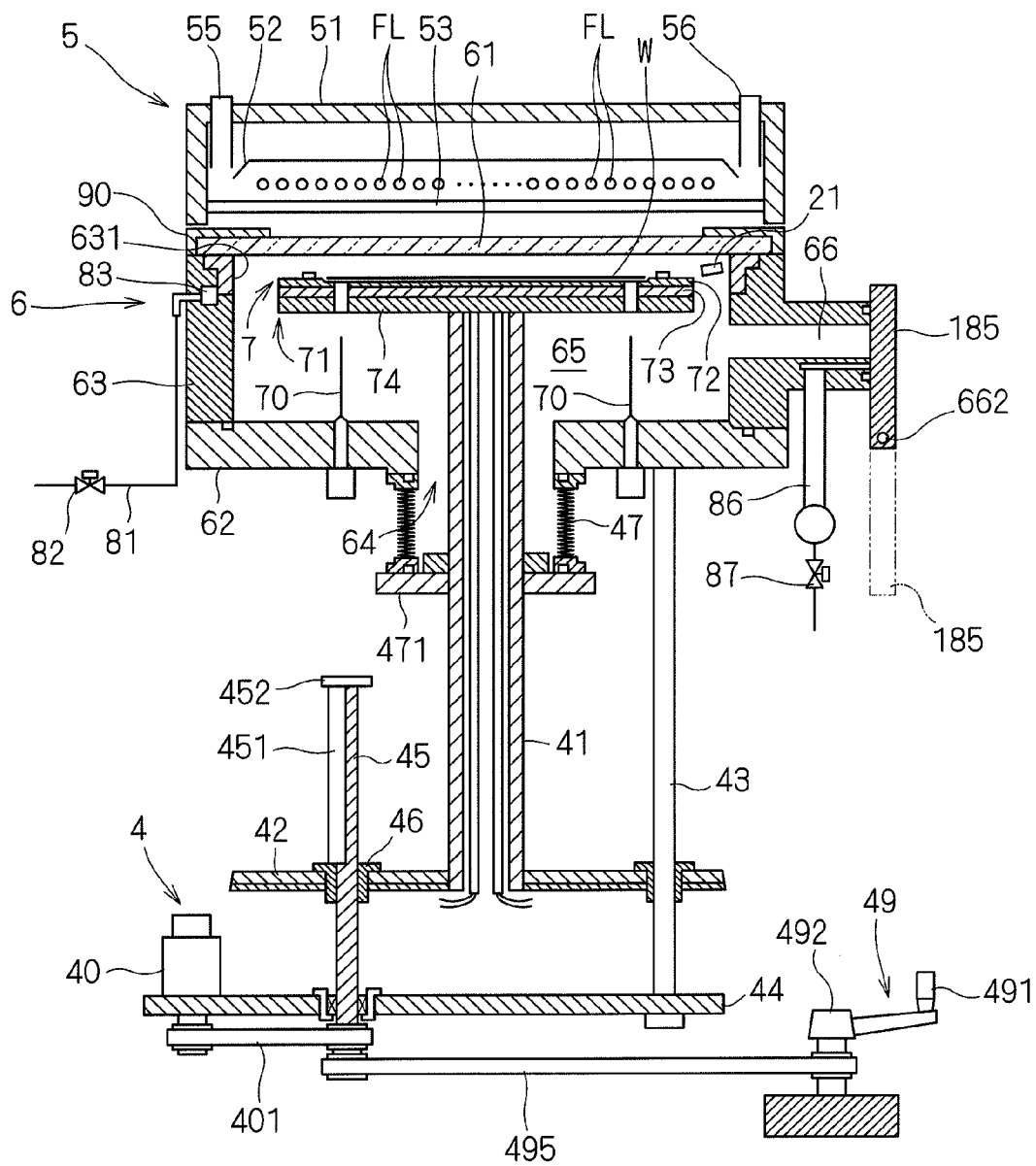
FIG. 5 is a longitudinal sectional view showing the configuration of the heat treatment apparatus of FIG. 1.

Preferred embodiments according to the present invention will now be described in detail with reference to the drawings.
<First Preferred Embodiment>

First, a general configuration of a heat treatment apparatus according to the present invention will be outlined. FIG. 1 is a longitudinal sectional view showing a configuration of a heat treatment apparatus 1 according to the present invention. The heat treatment apparatus 1 is a flash lamp annealer for irradiating a generally circular semiconductor wafer W serving as a substrate with flashes of light to heat the semiconductor wafer W.

The heat treatment apparatus 1 includes a generally cylindrical chamber 6 for receiving a semiconductor wafer W therein, and a lamp house 5 including a plurality of built-in flash lamps FL. The heat treatment apparatus 1 further includes a controller 3 for controlling operating mechanisms provided in the chamber 6 and in the lamp house 5 to cause the operating mechanisms to heat-treat a semiconductor wafer W.

The chamber 6 is provided under the lamp house 5, and includes a chamber side portion 63 having a generally cylindrical inner wall and a chamber bottom portion 62 covering the bottom of the chamber side portion 63. A space surrounded by the chamber side portion 63 and the chamber bottom portion 62 is defined as a heat treatment space 65. A top opening 60 is provided over the heat treatment space 65. A chamber window 61 is mounted to block the top opening 60.

The chamber window 61 forming the ceiling of the chamber 6 is a disk-shaped member made of quartz, and serves as a quartz window that transmits light emitted from the lamp house 5 therethrough into the heat treatment space 65. The chamber bottom portion 62 and the chamber side portion 63, which form the main body of the chamber 6, are made of, for example, a metal material such as stainless steel with high strength and high heat resistance. An upper ring 631 on the inner side surface of the chamber side portion 63 is made of an aluminum (Al) alloy or the like with greater durability than stainless steel against degradation due to irradiation with light.

The chamber window 61 and the chamber side portion 63 are sealed with an O-ring for the purpose of maintaining the hermeticity of the heat treatment space 65. Specifically, the O-ring is inserted between an underside peripheral portion of the chamber window 61 and the chamber side portion 63, and a clamp ring 90 is provided to abut against an upper-side peripheral portion of the chamber window 61 and to be screwed to the chamber side portion 63, thereby forcing the chamber window 61 against the O-ring.

The chamber bottom portion 62 has a plurality of (in this preferred embodiment, three) support pins 70 extending upright therefrom through a holder 7 and configured to support a semiconductor wafer W from the underside (the surface opposite the surface that receives light from the lamp house 5) of the semiconductor wafer W. The support pins 70 are made of, for example, quartz and are easy to replace because the support pins 70 are fixed from outside the chamber 6.

The chamber side portion 63 has a transport opening 66 for the transport of a semiconductor wafer W therethrough into and out of the chamber 6. The transport opening 66 is openable and closable by a gate valve 185 pivoting about an axis 662. An inlet passage 81 for introducing a processing gas (for example, an inert gas such as nitrogen ($N_2$) gas, helium (He) gas, and argon (Ar) gas; or oxygen ($O_2$) gas and the like) into the heat treatment space 65 is provided on the opposite side of the chamber side portion 63 from the transport opening 66. The inlet passage 81 has a first end connected through a valve 82 to a gas supply mechanism not shown, and a second end connected to a gas inlet buffer 83 provided inside the chamber side portion 63. The transport opening 66 is provided with an outlet passage 86 for exhausting a gas from the interior of the heat treatment space 65. The outlet passage 86 is connected through a valve 87 to an exhaust mechanism not shown.

FIG. 2 is a sectional view of the chamber 6 taken along a horizontal plane at the level of the gas inlet buffer 83. As shown in FIG. 2, the gas inlet buffer 83 is provided to extend over approximately one third of the inner periphery of the chamber side portion 63 on the opposite side from the transport opening 66 shown in FIG. 1. The processing gas introduced through the inlet passage 81 to the gas inlet buffer 83 is fed through a plurality of gas feed holes 84 into the heat treatment space 65.

The heat treatment apparatus 1 further includes the generally disk-shaped holder 7 for holding a semiconductor wafer W in a horizontal position inside the chamber 6 and preheating the held semiconductor wafer W prior to irradiation with flashes of light; and a holder elevating mechanism 4 for moving the holder 7 upwardly and downwardly relative to the chamber bottom portion 62 serving as the bottom surface of the chamber 6. The holder elevating mechanism 4 shown in FIG. 1 includes a shaft 41 of a generally cylindrical configuration, a movable plate 42, guide members 43 (in this preferred embodiment, three guide members 43 are provided around the shaft 41), a fixed plate 44, a ball screw 45, a nut 46, and a motor 40. The chamber bottom portion 62 serving as the bottom of the chamber 6 has a bottom opening 64 of a generally circular configuration having a diameter smaller than that of the holder 7. The shaft 41 made of stainless steel is inserted through the bottom opening 64 and connected to the lower surface of the holder 7 (a hot plate 71 in the holder 7 in a strict sense) to support the holder 7.

The nut 46 in threaded engagement with the ball screw 45 is fixed to the movable plate 42. The movable plate 42 is movable in a vertical direction by being slidably guided by the guide members 43 that are fixed to and extend downwardly from the chamber bottom portion 62. The movable plate 42 is coupled to the holder 7 through the shaft 41.

The motor 40 is provided on the fixed plate 44 mounted to the lower end portions of the guide members 43, and is connected to the ball screw 45 through a timing belt 401. For the holder elevating mechanism 4 to move the holder 7 upwardly and downwardly, the motor 40 serving as a driver rotates the ball screw 45 under the control of the controller 3 to move the movable plate 42 fixed to the nut 46 vertically along the guide members 43. As a result, the shaft 41 fixed to the movable plate 42 is moved vertically, so that the holder 7 connected to the shaft 41 is moved smoothly upwardly and downwardly between a transfer position shown in FIG. 1 in which a semiconductor wafer W is transferred and a treatment position shown in FIG. 5 in which the semiconductor wafer W is treated.

An upright mechanical stopper 451 of a generally semi-cylindrical shape (the shape formed by cutting a cylinder into half in a longitudinal direction) is provided on the upper surface of the movable plate 42 so as to extend along the ball screw 45. If the movable plate 42 tends to move upwardly beyond a predetermined upper limit because of any anomaly, the upper end of the mechanical stopper 451 strikes an end plate 452 provided at an end portion of the ball screw 45, so that the abnormal upward movement of the movable plate 42 is prevented. This prevents the holder 7 from being moved upwardly above a predetermined position lying under the chamber window 61, thereby avoiding a collision between the holder 7 and the chamber window 61.

The holder elevating mechanism 4 further includes a manual elevating part 49 for manually moving the holder 7 upwardly and downwardly during the maintenance of the interior of the chamber 6. The manual elevating part 49 has a handle 491 and a rotary shaft 492. Rotating the rotary shaft 492 by means of the handle 491 causes the rotation of the ball screw 45 connected through a timing belt 495 to the rotary shaft 492, thereby moving the holder 7 upwardly and downwardly.

An expandable and contractible bellows 47 surrounding the shaft 41 and extending downwardly is provided under the chamber bottom portion 62, and has an upper end connected to the lower surface of the chamber bottom portion 62. The bellows 47 has a lower end mounted to a bellows lower end plate 471. The bellows lower end plate 471 is screw-held and mounted to the shaft 41 with a collar member 411. The bellows 47 contracts when the holder elevating mechanism 4 moves the holder 7 upwardly relative to the chamber bottom portion 62, and expands when the holder elevating mechanism 4 moves the holder 7 downwardly. When the holder 7 moves upwardly and downwardly, the bellows 47 contracts and expands to maintain the heat treatment space 65 hermetically sealed.

FIG. 3 is a sectional view showing a configuration of the holder 7. The holder 7 includes the hot plate (heating plate) 71 for preheating (or assist-heating) a semiconductor wafer W, and a susceptor 72 provided on the upper surface (a surface on which the holder 7 holds a semiconductor wafer W) of the hot plate 71. The shaft 41 for moving the holder 7 upwardly and downwardly as mentioned above is connected to the lower surface of the holder 7. The susceptor 72 is made of quartz (or may be made of aluminum nitride (AlN) or the like). Pins 75 for preventing a semiconductor wafer W from shifting out of place are mounted on the upper surface of the susceptor 72. The susceptor 72 is provided on the hot plate 71, with the lower surface of the susceptor 72 in face-to-face contact with the upper surface of the hot plate 71. The susceptor 72 is thus capable of diffusing heat energy from the hot plate 71 to transfer the heat energy to a semiconductor wafer W placed on the upper surface of the susceptor 72, and is removable from the hot plate 71 for cleaning during maintenance.

The hot plate 71 includes an upper plate 73 and a lower plate 74 both made of stainless steel. Resistance heating wires 76 such as nichrome wires for heating the hot plate 71 are disposed between the upper plate 73 and the lower plate 74, and an electrically conductive brazing alloy containing nickel (Ni) fills the space between the upper plate 73 and the lower plate 74 to seal the resistance heating wires 76 therewith. The upper plate 73 and the lower plate 74 are brazed to each other at their ends.

FIG. 4 is a plan view of the hot plate 71. As shown in FIG. 4, the hot plate 71 has a disk-shaped zone 711 and an annular zone 712 arranged in concentric relation with each other and positioned in a central portion of a region opposed to the semiconductor wafer W held by the holder 7, and four zones 713 to 716 defined by circumferentially equally dividing a substantially annular region surrounding the zone 712 into four. Slight gaps are present between adjacent ones of the zones 711 to 716. The hot plate 71 is provided with three through holes 77 for receiving the respective support pins 70 therethrough and circumferentially spaced 120 degrees apart from each other along a gap between the zones 711 and 712.

In the six zones 711 to 716, the resistance heating wires 76 independent of each other are disposed so as to run around to form heaters, respectively. The heaters incorporated in the respective zones 711 to 716 individually heat the respective zones 711 to 716. A semiconductor wafer W held by the holder 7 is heated by the heaters incorporated respectively in the six zones 711 to 716. A sensor 710 for measuring the temperature of each of the zones 711 to 716 with a thermocouple is provided in each of the zones 711 to 716. The sensors 710 are connected to the controller 3 through the interior of the generally cylindrical shaft 41.

For heating the hot plate 71, the controller 3 controls the amount of power supplied to the resistance heating wires 76 provided in the respective zones 711 to 716 so that the temperatures of the six zones 711 to 716 measured by the sensors 710, respectively, reach a predetermined temperature that is previously set. The temperature control in each of the zones 711 to 716 by the controller 3 is PID (proportional integral derivative) control. In the hot plate 71, the temperature of each of the zones 711 to 716 is continuously measured until the heat treatment of a semiconductor wafer W is completed (or, when there are a plurality of semiconductor wafers W to be treated in succession, until the heat treatment of all of the semiconductor wafers W is completed), and the amount of power supplied to the resistance heating wires 76 disposed in each of the zones 711 to 716 is controlled individually, i.e. the temperature of the heater incorporated in each of the zones 711 to 716 is controlled individually, so that the temperature of each of the zones 711 to 716 is kept at the set temperature. The set temperature for each of the zones 711 to 716 may be changed by an individually set offset value from a reference temperature.

The resistance heating wires 76 provided in the six zones 711 to 716 are connected through power lines passing through the interior of the shaft 41 to a power supply source (not shown). On the way from the power supply source to the zones 711 to 716, the power lines extending from the power supply source are disposed inside a stainless steel tube filled with an insulator such as magnesia (magnesium oxide) or the like so as to be electrically insulated from each other. The interior of the shaft 41 is open to the atmosphere.

A photodiode 21 is provided in the heat treatment space 65 of the chamber 6. The position of the photodiode 21 is above the holder 7 moved upwardly to the treatment position of a semiconductor wafer W shown in FIG. 5. The photodiode 21 is inclined so that the tip of the photodiode 21 faces toward the semiconductor wafer W held by the holder 7 in the treatment position, and receives radiant light emitted from the surface of the semiconductor wafer W held by the holder 7. The photodiode 21 in this preferred embodiment uses a wavelength of not less than 3 µm for measurements.

Next, the lamp house 5 is provided separately from the chamber 6. The lamp house 5 includes an enclosure 51, a light source having the plurality of (in this preferred embodiment, 30) xenon flash lamps FL provided inside the enclosure 51, and a reflector 52 provided inside the enclosure 51 so as to cover the light source from above. The lamp house 5 further includes a lamp light radiation window 53 mounted to the bottom of the enclosure 51. The lamp light radiation window 53 forming the floor portion of the lamp house 5 is a plate-like member made of quartz. The lamp house 5 is provided over the chamber 6, whereby the lamp light radiation window 53 is opposed to the chamber window 61. The lamp house 5 is configured to direct flashes of light from the flash lamps FL through the lamp light radiation window 53 and the chamber window 61 onto a semiconductor wafer W held by the holder 7 within the chamber 6, thereby heating the semiconductor wafer W.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is a horizontal plane.

Figure 6:
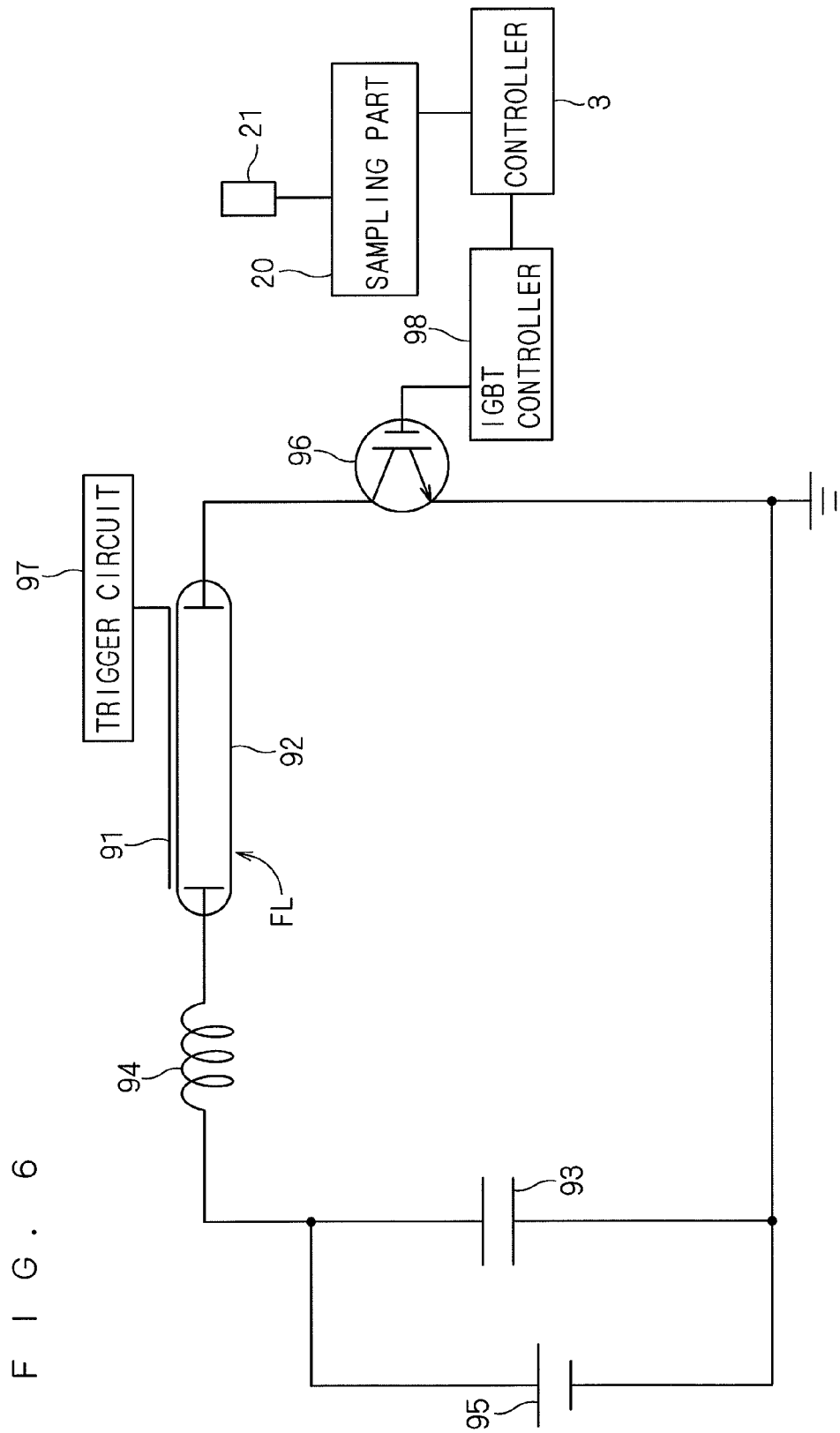
FIG. 6 is a diagram of a driving circuit for a flash lamp.

FIG. 6 is a diagram showing a driving circuit for each flash lamp FL. As illustrated in FIG. 6, a capacitor 93, a coil 94, a flash lamp FL, and an IGBT (insulated-gate bipolar transistor) 96 are connected in series. The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage. A trigger circuit 97 is capable of applying a high voltage to the trigger electrode 91. The timing of the voltage application from the trigger circuit 97 to the trigger electrode 91 is under the control of the controller 3.

The IGBT 96 is a bipolar transistor which includes a MOS-FET (metal-oxide-semiconductor field-effect transistor) incorporated in the gate thereof, and is also a switching element suitable for handling a large amount of power. The gate of the IGBT 96 is connected to an IGBT controller 98. The IGBT controller 98 is a circuit for applying a signal to the gate of the IGBT 96 to drive the IGBT 96. Specifically, the IGBT 96 turns ON, when the IGBT controller 98 applies a voltage (a "high" voltage) not less than a predetermined level to the gate of the IGBT 96; the IGBT 96 turns OFF, when the IGBT controller 98 applies a voltage (a "low" voltage) less than the predetermined level to the gate of the IGBT 96. In this manner, the circuit including the flash lamp FL is turned ON and OFF by the IGBT 96. By turning the IGBT 96 ON and OFF, the current flowing from the capacitor 93 to the flash lamp FL is established and interrupted. The IGBT controller 98 switches ON and OFF the IGBT 96 under the control of the controller 3.

Even if, with the capacitor 93 in the charged state, the IGBT 96 turns ON to apply a high voltage across the electrodes of the glass tube 92, no electricity will flow through the glass tube 92 in a normal state because the xenon gas is electrically insulative. However, if the trigger circuit 97 applies a high voltage to the trigger electrode 91 to produce an electrical breakdown, an electrical discharge across the electrodes causes a current to flow momentarily in the glass tube 92, so that xenon atoms or molecules are excited at this time to cause light emission.

The reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting to produce a stain finish thereon. Such surface roughening is required, because if the reflector 52 has a perfect mirror surface, the intensity of the reflected light from the plurality of flash lamps FL will exhibit a regular pattern, which in turn gives rise to deterioration in the uniformity of a surface temperature distribution in the semiconductor wafer W.

Figure 7:
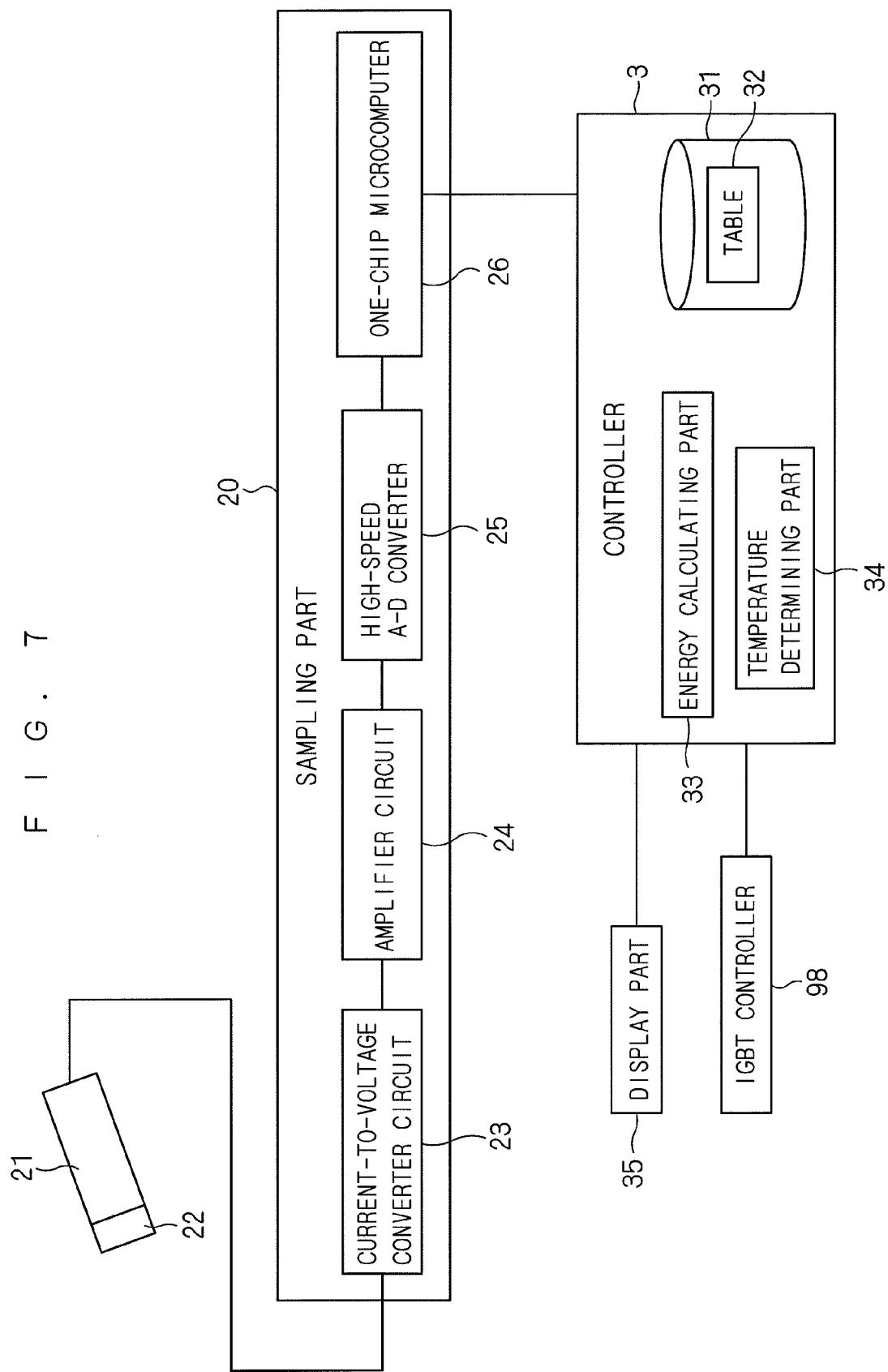
FIG. 7 is a block diagram showing a configuration of a sampling part and a controller.

As shown in FIG. 6, the heat treatment apparatus 1 according to this preferred embodiment further includes a sampling part 20 for sampling an output signal from the photodiode 21 to transmit sampled data to the controller 3. FIG. 7 is a block diagram showing a configuration of the sampling part 20 and the controller 3. An interference filter 22 is provided at the tip of the photodiode 21 provided in the heat treatment space 65. The interference filter 22 is a filter that is selectively transparent to only light in a predetermined wavelength range. The interference filter 22 in the first preferred embodiment is selectively transparent to light having a wavelength of 3 µm.

The photodiode 21 generates a photoelectric current in accordance with the intensity of received light because of a photovoltaic effect. The photodiode 21 has the characteristic of being extremely short in response time. The photodiode 21 is electrically connected to the sampling part 20, and transmits a signal generated in response to the reception of light to the sampling part 20.

The sampling part 20 includes a current-to-voltage converter circuit 23, an amplifier circuit 24, a high-speed A-D converter 25, and a one-chip microcomputer 26. The current-to-voltage converter circuit 23 is a circuit for converting a weak current generated by the photodiode 21 into an easy-to-handle voltage signal. The current-to-voltage converter circuit 23 may be constructed using an operational amplifier, for example.

The amplifier circuit 24 amplifies the voltage signal outputted from the current-to-voltage converter circuit 23 to output the amplified voltage signal to the high-speed A-D converter 25. The high-speed A-D converter 25 converts the voltage signal amplified by the amplifier circuit 24 into a digital signal. The one-chip microcomputer 26, which is a kind of microcomputer, is in general a processor having a CPU, a memory, a timer and the like mounted on a single IC chip. The one-chip microcomputer 26 is not capable of performing general-purpose processes, but is capable of performing a specific process at high speeds. The one-chip microcomputer 26 according to this preferred embodiment executes a previously set processing program to sample the digital signal outputted from the high-speed A-D converter 25 at predetermined time intervals, thereby sequentially storing sampled digital data in a memory included in the chip. The sampling time intervals in the one-chip microcomputer 26 may be set as appropriate but set to a minimum of two microseconds (μs).

The one-chip microcomputer 26 in the sampling part 20 is connected to the controller 3 via telecommunication lines. The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk 31 for storing control software, data and the like thereon. The controller 3 is connected to the IGBT controller 98 and to a display part 35, and is capable of causing results of computations and the like to appear on the display part 35 as well as controlling the operation of the IGBT controller 98. The display part 35 may be constructed, for example, using a liquid crystal display.

The controller 3 is capable of performing general-purpose processes, but is not capable of performing a sampling process at time intervals as short as those in the one-chip microcomputer 26. The digital data stored in the memory included in the chip by the one-chip microcomputer 26 are transferred to the controller 3, and are then stored on the magnetic disk 31. The controller 3 further includes an energy calculating part 33 and a temperature determining part 34. The energy calculating part 33 and the temperature determining part 34 are functional processors implemented by the CPU in the controller 3 executing a predetermined processing program, and the details on the processing in the energy calculating part 33 and the temperature determining part 34 will be further described later. The telecommunication lines connecting the one-chip microcomputer 26 and the controller 3 may be those for serial communication or for parallel communication.

The heat treatment apparatus 1 further includes, in addition to the aforementioned components, various cooling structures to prevent an excessive temperature rise in the chamber 6 and the lamp house 5 because of the heat energy generated from the flash lamps FL and the hot plate 71 during the heat treatment of a semiconductor wafer W. As an example, a water cooling tube (not shown) is provided in the chamber side portion 63 and the chamber bottom portion 62 of the chamber 6. The lamp house 5 has an air cooling structure in which a gas supply pipe 55 and an exhaust pipe 56 are provided to form a gas flow therein, thereby exhausting heat (with reference to FIGS. 1 and 5). Air is also supplied to a gap between the chamber window 61 and the lamp light radiation window 53 to cool down the lamp house 5 and the chamber window 61.

Figure 8:
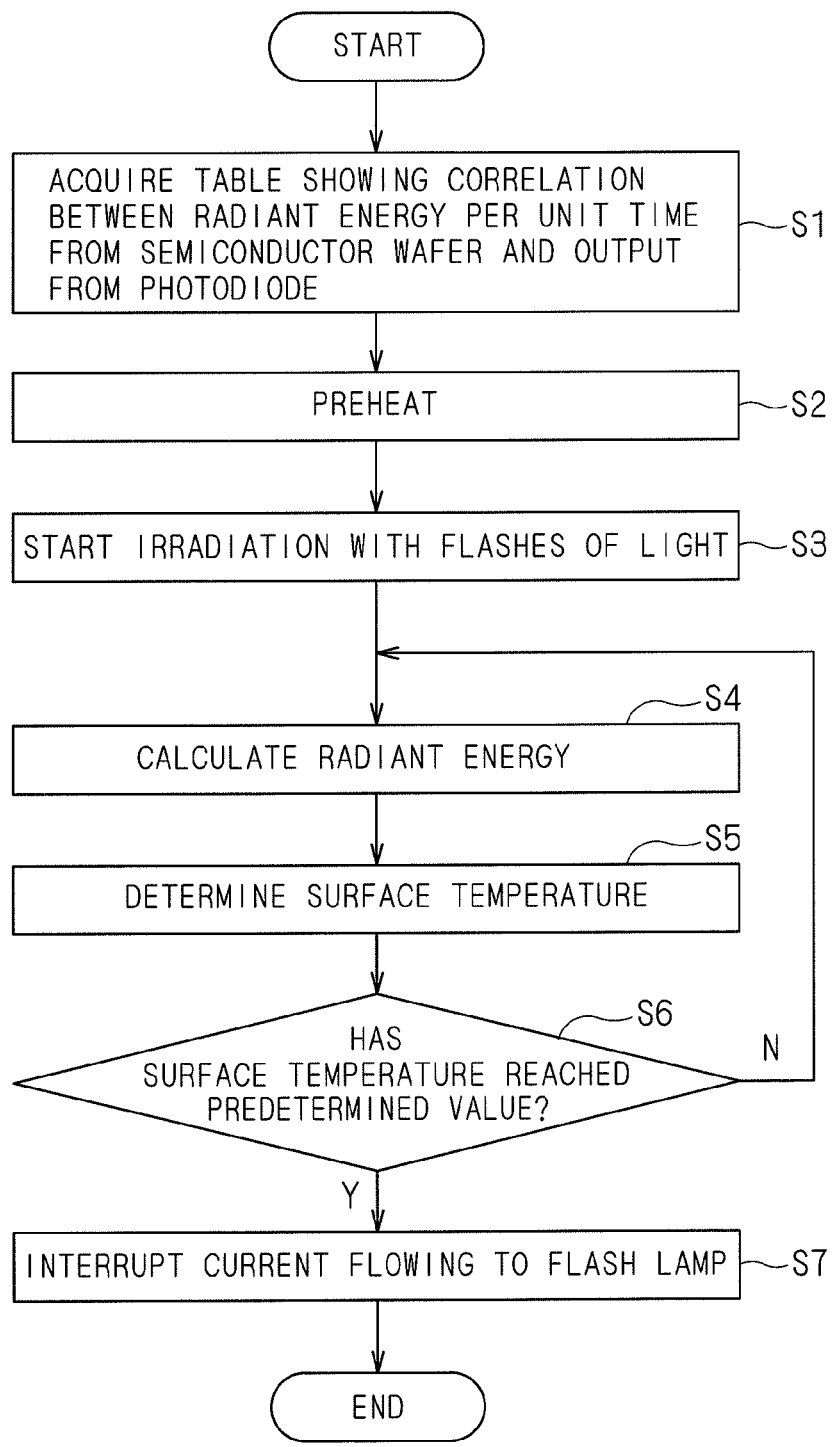
FIG. 8 is a flow diagram showing a procedure in the heat treatment apparatus of FIG. 1.

Next, the operation of the heat treatment apparatus 1 having the aforementioned configuration will be described. FIG. 8 is a flow diagram showing a procedure in the heat treatment apparatus 1. A semiconductor wafer W to be treated or processed herein is a semiconductor substrate doped with impurities (ions) by an ion implantation process. The impurities are activated by the heat treatment apparatus 1 performing the process of heating (annealing) the semiconductor wafer W by irradiation with flashes of light.

Prior to the processing in the heat treatment apparatus 1, a table 32 is acquired which shows a correlation between radiant energy per unit time from a semiconductor wafer W and an output from the photodiode 21 (in Step S1). The term "radiant energy" used herein shall mean radiant energy per unit time. In the first preferred embodiment, radiant energy from a semiconductor wafer W is determined from the theoretical value of the energy of black body radiation.

According to Planck's law for black body radiation, the radiant energy W(λ·T) of radiant light having a wavelength λ (m) from a black body at a temperature T (K) is expressed by $$W(\lambda \cdot T) = \frac{8\pi hc}{\lambda^5} \frac{1}{e^{\frac{hc}{\lambda kT}} - 1} \tag{1}$$

where c is a constant indicating the velocity of light ($3\times10^8$ (m/s)), k is the Boltzmann constant ($1.3807\times10^{-23}$ (J/K)), h is the Planck's constant ($6.626\times10^{-34}$ (J·s)), and the radiant energy W(λ·T) is in W/m².

In the first preferred embodiment, the values of the radiant energy W(λ·T) are sequentially calculated by increasing the temperature T in increments of 10° C. from 500° C. where the wavelength λ is 3 μm for measurement in the photodiode 21. This provides calculations of the radiant energy of radiant light having a wavelength of 3 μm from a black body at temperatures in increments of 10° C. from 500° C. The values of the radiant energy of black body radiation calculated herein are theoretical values determined according to the Planck's law.

Multiplying the radiant energy of black body radiation calculated from Equation (1) by the emissivity ε of a semiconductor wafer W provides the theoretical value of the radiant energy from the semiconductor wafer W. In the first preferred embodiment, the theoretical values of the radiant energy of infrared light having a wavelength of 3 μm emitted from the semiconductor wafer W are calculated at temperatures in increments of 10° C. from 500° C.

On the other hand, a semiconductor wafer W held by the holder 7 moved upwardly to the treatment position shown in FIG. 5 is heated by the hot plate 71 of the holder 7, and the intensity of the radiant light emitted from the semiconductor wafer W is actually measured with the photodiode 21. For this actual measurement, the same conditions as those for the calculation of the theoretical values of the radiant energy from the semiconductor wafer W described above are used. Specifically, the semiconductor wafer W is heated by the holder 7 to temperatures in increments of 10° C. from 500° C., and the intensity of infrared light having a wavelength of 3 μm received by the photodiode 21 is measured at each of the temperatures. The temperature of the semiconductor wafer W is precisely controlled to a predetermined temperature by adjusting the temperature of the hot plate 71 based on the results of temperature measurements with the sensors 710.

The actual measurement of radiant light from a semiconductor wafer W will be further described. The surface of the semiconductor wafer W held by the holder 7 and heated to a predetermined temperature emits radiant light having an intensity dependent on the surface temperature of the semiconductor wafer W. Part of the radiant light emitted from the surface of the semiconductor wafer W enters the interference filter 22 provided at the tip of the photodiode 21. In the first preferred embodiment, infrared light having a wavelength of 3 μm included in the radiant light emitted from the semiconductor wafer W enters the photodiode 21 because the interference filter 22 is selectively transparent to light having a wavelength of 3 μm.

The photodiode 21 generates a photoelectric current in accordance with the intensity of the received infrared light having a wavelength of 3 μm. The current generated by the photodiode 21 is converted into an easy-to-handle voltage signal by the current-to-voltage converter circuit 23. The voltage signal outputted from the current-to-voltage converter circuit 23 is amplified by the amplifier circuit 24, and the amplified voltage signal is converted by the high-speed A-D converter 25 into a digital signal which is suitable for a computer to handle. The level of the digital signal outputted from the high-speed A-D converter 25 is an input voltage to the one-chip microcomputer 26, and the input voltage is in turn acquired as an output from the photodiode 21.

The output from the photodiode 21, which is acquired by the one-chip microcomputer 26, is transmitted to the controller 3. Then, the controller 3 produces the table 32 showing a correlation between the transmitted output value from the photodiode 21 and the theoretical value of the radiant energy from the semiconductor wafer W obtained by the above-mentioned calculation. In this process, the controller 3 brings the theoretical value and the actually measured value under the same condition into correspondence with each other for the production of the table 32. For example, the controller 3 establishes a correspondence between the theoretical value calculated as the radiant energy from a semiconductor wafer W at 500° C. and the output value from the photodiode 21 having received the radiant light emitted from the semiconductor wafer W heated to 500° C. by the holder 7. The controller 3 similarly establishes correspondences at 510° C., 520° C. and other temperatures to acquire the table 32 showing the correlation between the radiant energy from the semiconductor wafer W and the output from the photodiode 21.

FIG. 9 is a graph illustrating an example of the table 32 showing a correlation between the radiant energy per unit time from a semiconductor wafer W and the output from the photodiode 21. As shown in FIG. 9, the radiant energy from the semiconductor wafer W as a function of the output from the photodiode 21 is shown in the form of a table. By making reference to the table 32, the radiant energy from a semiconductor wafer W is determined from the output from the photodiode 21.

The table 32 showing such a correlation is previously acquired using a dummy wafer and the like and stored on the magnetic disk 31 in the controller 3 prior to the heat treatment of a semiconductor wafer W to be treated or processed (with reference to FIG. 7). With the table 32 stored on the magnetic disk 31, the processes in Step S2 and its subsequent steps of FIG. 8 are performed. The procedure in Step S2 and its subsequent steps in the heat treatment apparatus 1 which will be described below proceeds under the control of the controller 3 over the operating mechanisms of the heat treatment apparatus 1.

First, the holder 7 is moved downwardly from the treatment position shown in FIG. 5 to the transfer position shown in FIG. 1. The term "treatment position" as used herein refers to the position of the holder 7 where light is emitted from the flash lamps FL onto a semiconductor wafer W, i.e., the position of the holder 7 shown in FIG. 5 within the chamber 6. The term "transfer position" as used herein refers to the position of the holder 7 where a semiconductor wafer W is transported into and out of the chamber 6, i.e., the position of the holder 7 shown in FIG. 1 within the chamber 6. A reference position of the holder 7 in the heat treatment apparatus 1 is the treatment position. Prior to treatment, the holder 7 is in the treatment position. Upon the start of treatment, the holder 7 is moved downwardly to the transfer position. When moved downwardly to the transfer position as illustrated in FIG. 1, the holder 7 comes in close proximity to the chamber bottom portion 62, so that the upper ends of the support pins 70 protrude through the holder 7 upwardly out of the holder 7.

Next, when the holder 7 is moved downwardly to the transfer position, the valve 82 and the valve 87 are opened to introduce nitrogen gas at room temperature into the heat treatment space 65 of the chamber 6. Subsequently, the gate valve 185 is opened to open the transport opening 66. A transport robot outside the heat treatment apparatus 1 transports a semiconductor wafer W to be treated through the transport opening 66 into the chamber 6, and places the semiconductor wafer W onto the plurality of support pins 70.

The nitrogen gas introduced into the chamber 6 during the transport of the semiconductor wafer W into the chamber 6 is purged from the chamber 6 at a rate of about 40 L/min. The introduced nitrogen gas flows from the gas inlet buffer 83 in the direction of the arrows AR4 in FIG. 2 within the chamber 6, and is exhausted through the outlet passage 86 and the valve 87 shown in FIG. 1 by a utility exhaust system. Part of the nitrogen gas introduced into the chamber 6 is also exhausted from an exhaust port (not shown) provided inside the bellows 47. In the steps to be described below, the nitrogen gas is continuously introduced into and exhausted from the chamber 6, and the amount of nitrogen gas introduced into the chamber 6 is changed to various amounts in accordance with the steps of treating the semiconductor wafer W.

After the semiconductor wafer W is transported into the chamber 6, the gate valve 185 closes the transport opening 66. Then, the holder elevating mechanism 4 moves the holder 7 upwardly from the transfer position to the treatment position, which is in close proximity to the chamber window 61. In the course of the upward movement of the holder 7 from the transfer position, the semiconductor wafer W is transferred from the support pins 70 to the susceptor 72 of the holder 7, and then placed and held on the upper surface of the susceptor 72. When the holder 7 is moved upwardly to the treatment position, the semiconductor wafer W held on the susceptor 72 is also held in the treatment position.

Each of the six zones 711 to 716 of the hot plate 71 has been already heated up to a predetermined temperature by the heater (the resistance heating wires 76) individually incorporated within each of the zones 711 to 716 (between the upper plate 73 and the lower plate 74). The holder 7 is moved upwardly to the treatment position, so that the semiconductor wafer W comes in contact with the holder 7. This allows the heaters incorporated in the hot plate 71 to preheat the semiconductor wafer W, thereby raising the temperature of the semiconductor wafer W gradually (in Step S2).

Figure 10:
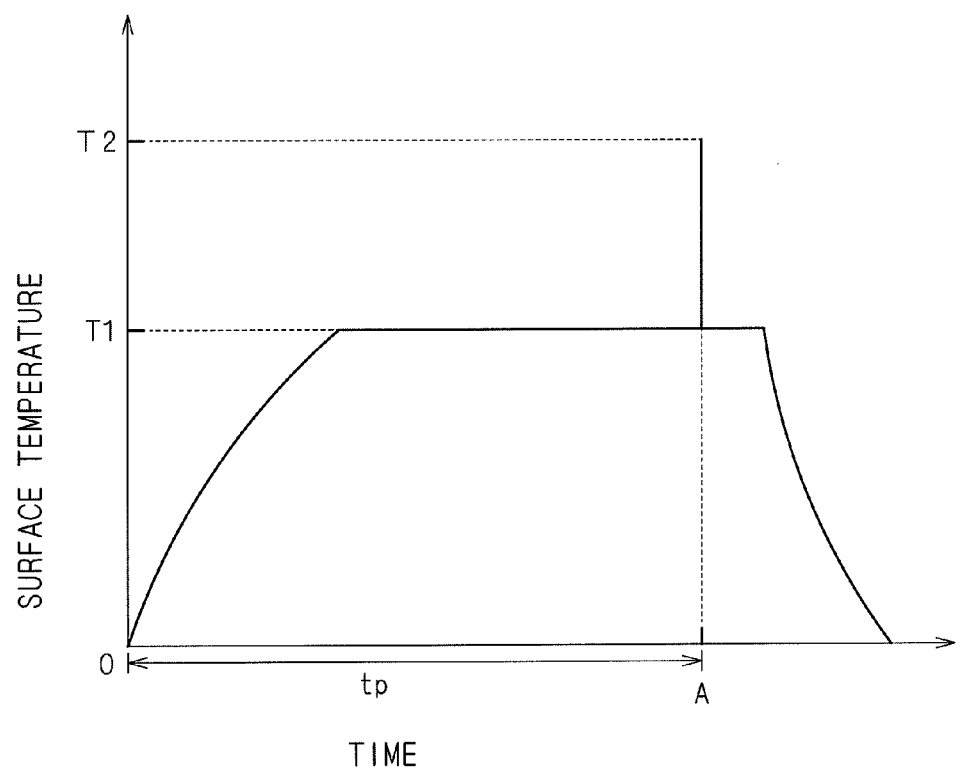
FIG. 10 is a graph showing changes in the surface temperature of a semiconductor wafer after the start of preheating.

FIG. 10 is a graph showing changes in the surface temperature of a semiconductor wafer W after the start of preheating. Preheating the semiconductor wafer W in the treatment position for a time period tp causes the temperature of the semiconductor wafer W to rise up to a preset preheating temperature T1. The preheating temperature T1 shall be on the order of 200 to 800° C., preferably on the order of 350 to 600° C., (in the present preferred embodiment, 500° C.) at which there is no apprehension that the impurities implanted in the semiconductor wafer W are diffused by heat. The time period tp for preheating the semiconductor wafer W shall be on the order of 3 to 200 seconds (in the present preferred embodiment, 60 seconds). A distance between the holder 7 and the chamber window 61 is freely adjustable by controlling the amount of rotation of the motor 40 of the holder elevating mechanism 4.

After a lapse of the preheating time period tp, the flash lamps FL start heating the semiconductor wafer W by irradiating the semiconductor wafer W with flashes of light at time A, with the holder 7 remaining in the treatment position (in Step S3). For the irradiation with light from the flash lamps FL, the capacitor 93 is charged in advance by the power supply unit 95. Then, with the capacitor 93 in the charged state, the IGBT controller 98 turns ON the IGBT 96 and the trigger circuit 97 applies a high voltage to the trigger electrode 91 under the control of the controller 3.

When the IGBT 96 turns ON, with the capacitor 93 in the charged state, and a high voltage is applied to the trigger electrode 91 in synchronism therewith, the electrical charges stored in the capacitor 93 are discharged across the electrodes of the glass tube 92 in each of the flash lamps FL and start to flow in the form of a current, and the resultant excitation of xenon atoms or molecules induces light emission. That is, each flash lamp FL starts to emit light, and the value of the current flowing through each flash lamp FL increases with time. The emission intensity of each flash lamp FL is roughly proportional to the current flowing through each flash lamp FL. The emission intensity of each flash lamp FL accordingly increases with time. It should be noted that the waveform itself of the current flowing through each flash lamp FL is defined by the constant of the coil 94.

The irradiation of the semiconductor wafer W with flashes of light from the flash lamps FL causes the surface temperature of the semiconductor wafer W held by the holder 7 in the treatment position to increase from the preheating temperature T1. At this time, part of the radiant light emitted from the surface of the semiconductor wafer W enters the photodiode 21 through the interference filter 22. In the first preferred embodiment, infrared light having a wavelength of 3 μm included in the radiant light emitted from the semiconductor wafer W enters the photodiode 21 because the interference filter 22 is selectively transparent to infrared light having a wavelength of 3 μm.

Upon receipt of infrared light, as mentioned above, the photodiode 21 generates a photoelectric current, which in turn is converted into a voltage signal by the current-to-voltage converter circuit 23. The voltage signal is amplified by the amplifier circuit 24, and the amplified voltage signal is converted by the high-speed A-D converter 25 into a digital signal. The level of the digital signal outputted from the high-speed A-D converter 25 is an input voltage to the one-chip microcomputer 26, and the input voltage in turn is acquired as an output from the photodiode 21. The output value from the photodiode 21, which is acquired by the one-chip microcomputer 26, is transmitted to the controller 3. It should be noted that, when the photodiode 21 receives the radiant light from the semiconductor wafer W, the flash lamps FL also emit light. However, the wavelength of light emitted from the xenon flash lamps FL ranges from ultraviolet to near-infrared regions (a wavelength in the range on the order of 200 to 2000 nm), and little infrared light having a wavelength of 3 μm or higher is included in the flashes of light. This preferred embodiment, in which the infrared light having a wavelength of 3 μm is received by and measured with the photodiode 21, prevents the flashes of light themselves from serving as disturbance light when the intensity of the radiant light from the semiconductor wafer W is measured during flash heating.

Next, the energy calculating part 33 in the controller 3 calculates the radiant energy emitted per unit time from the semiconductor wafer W from the output from the photodiode 21 inputted to the controller 3 (in Step S4). Based on the table 32 stored on the magnetic disk 31 as shown in FIG. 9, the energy calculating part 33 determines the radiant energy emitted from the semiconductor wafer W raised in temperature by being irradiated with flashes of light from the flash lamps FL from the output from the photodiode 21.

Subsequently, the temperature determining part 34 in the controller 3 determines the surface temperature from the radiant energy from the semiconductor wafer W (in Step S5). Based on Equation (2) below which is derived from the Stefan-Boltzmann law, the temperature determining part 34 determines the surface temperature $T_W$ of the semiconductor wafer W from the radiant energy $E_W$ per unit time from the semiconductor wafer W which is determined by the energy calculating part 33.

$$T_W = \sqrt[4]{\frac{E_W}{\varepsilon \cdot \delta}} \quad (2)$$

where $\varepsilon$ is the emissivity of the semiconductor wafer W, and $\delta$ is the Stefan-Boltzmann constant.

Next, the controller 3 makes a determination as to whether the surface temperature $T_W$ of the semiconductor wafer W which is determined by the temperature determining part 34 has reached a previously set target temperature T2 or not (in Step S6). When the determined surface temperature $T_W$ of the semiconductor wafer W has not reached the target temperature T2, the procedure returns to Step S4, and the calculation of the radiant energy from the semiconductor wafer W and the determination of the surface temperature are repeated. In other words, the processes in Steps S4 to S6 are repeated until the determined surface temperature $T_W$ of the semiconductor wafer W reaches the target temperature T2.

The temperature of the surface of the semiconductor wafer W irradiated with flashes of light rises rapidly within several milliseconds. Because of its extremely short response time, the photodiode 21 is capable of following the radiant light from the semiconductor wafer W which dramatically changes in intensity within a short time. This allows the time required for one cycle from Step S4 to Step S6, i.e. a sampling time interval at which the radiant energy from the semiconductor wafer W and the surface temperature thereof are sampled, to reach tens of microseconds, thereby achieving the acquisition of a history of the surface temperature of the semiconductor wafer W which rises rapidly after the irradiation with flashes of light. The controller 3 may causes the history of the surface temperature of the semiconductor wafer W during the irradiation with flashes of light which is acquired in this manner to appear on the display part 35.

On the other hand, when the surface temperature $T_W$ of the semiconductor wafer W which is determined by the temperature determining part 34 reaches the target temperature T2, the IGBT controller 98 turns OFF the IGBT 96 to interrupt the current flowing from the capacitor 93 to each of the flash lamps FL under the control of the controller 3 (in Step S7). The interruption of the passage of current to the flash lamps FL causes the emission of light to stop, whereby the temperature of the surface of the semiconductor wafer W no longer irradiated with flashes of light falls rapidly.

FIG. 11 is a graph showing changes in the surface temperature of a semiconductor wafer W which are caused by controlling flashes of light. In the case where the target temperature T2 is set at "a," the passage of current to the flash lamps FL is interrupted at the point in time when time t1 has elapsed since the start of the irradiation with flashes of light. From that point on, the surface temperature of the semiconductor wafer W falls rapidly. In the case where the target temperature T2 is set at "b," on the other hand, the passage of current to the flash lamps FL is interrupted at the point in time when time t2 has elapsed since the start of the irradiation with flashes of light. From that point on, the surface temperature of the semiconductor wafer W falls rapidly. If the surface temperature $T_W$ of the semiconductor wafer W determined by the temperature determining part 34 falls without reaching the target temperature T2, error handling may be conducted.

In this manner, the irradiation with flashes of light from the flash lamps FL raises the surface temperature of the semiconductor wafer W to the target temperature T2 to activate the impurities implanted in the semiconductor wafer W, following which the passage of current to the flash lamps FL is interrupted, whereby the surface temperature of the semiconductor wafer W falls rapidly. After the semiconductor wafer W in the treatment position waits for about 10 seconds following the completion of the heating by irradiation with flashes of light using the flash lamps FL, the holder elevating mechanism 4 moves the holder 7 downwardly to the transfer position shown in FIG. 1 again, and the semiconductor wafer W is transferred from the holder 7 to the support pins 70. Subsequently, the transport opening 66, which has been closed by the gate valve 185, is opened, and the transport robot outside the heat treatment apparatus 1 transports the semiconductor wafer W placed on the support pins 70 out of the chamber 6. This completes the heat treatment of the semiconductor wafer W by irradiation with flashes of light in the heat treatment apparatus 1.

As described previously, the nitrogen gas is continuously fed into the chamber 6 during the heat treatment of the semiconductor wafer W in the heat treatment apparatus 1. The amount of nitrogen gas fed into the chamber 6 shall be about 30 liters per minute when the holder 7 is in the treatment position, and be about 40 liters per minute when the holder 7 is in other than the treatment position.

In the first preferred embodiment, the radiant energy from the semiconductor wafer W which is determined from the theoretical value of black body radiation and the actually measured result of the output from the photodiode 21 are brought into correspondence with each other, and the table 32 showing the correlation therebetween is acquired. Then, when the semiconductor wafer W to be treated is irradiated with flashes of light from the flash lamps FL, the photodiode 21 receives the radiant light emitted from the semiconductor wafer W. Based on the acquired table 32, the controller 3 determines the radiant energy emitted from the semiconductor wafer W irradiated with flashes of light from the output from the photodiode 21. Further, the controller 3 determines the surface temperature of the semiconductor wafer W from the determined radiant energy.

The table 32 showing the correlation between the radiant energy from the semiconductor wafer W and the output from the photodiode 21 is previously acquired, and the radiant energy is determined during the irradiation with flashes of light by checking the output from the photodiode 21 extremely short in response time against the table 32. Thus, the radiant energy from the semiconductor wafer W during the irradiation with flashes of light is determined in real time. As a result, the heat treatment apparatus 1 according to the first preferred embodiment is capable of making real-time measurements of the surface temperature of the semiconductor wafer W during the irradiation with flashes of light.

The capability to make real-time measurements of the surface temperature of the semiconductor wafer W during the irradiation with flashes of light allows the control over the emission of light from the flash lamps FL based on the results of the measurements. As the number of times that the flash lamps FL emit light increases, the energy of light emitted from the flash lamps FL decreases. The method according to the first preferred embodiment, however, is capable of precisely raising the surface temperature of the semiconductor wafer W to the target temperature T2 during the irradiation with flashes of light, regardless of the deterioration of the flash lamps FL.

<Second Preferred Embodiment>

Next, a second preferred embodiment according to the present invention will be described. A heat treatment apparatus in the second preferred embodiment is similar in configuration to that in the first preferred embodiment (with reference to FIGS. 1 to 7). Also, the heat treatment apparatus in the second preferred embodiment is generally similar in operation procedure to that in the first preferred embodiment (with reference to FIG. 8). For the acquisition of the table 32 according to the first preferred embodiment, the radiant energy from a semiconductor wafer W is determined from the theoretical value of black body radiation. The second preferred embodiment, however, uses a pyrometer to actually measure the radiant energy from a semiconductor wafer W.

The pyrometer 21a is a device that senses thermal radiation from an object to be measured in a non-contacting manner to measure the temperature of the object from Equation (2). It should be noted, however, that the pyrometer, which is low in response speed as compared with the photodiode 21, is not capable of following abrupt changes in the surface temperature of the semiconductor wafer W during the irradiation with flashes of light. For the acquisition of the table 32 according to the second preferred embodiment, the pyrometer is placed in the heat treatment space 65 of the chamber 6, and the semiconductor wafer W held by the holder 7 moved upwardly to the treatment position is heated by the hot plate 71 in the holder 7. The photodiode 21 is used to measure the intensity of the radiant light emitted from the semiconductor wafer W, and the pyrometer is used to measure the radiant energy from the semiconductor wafer W. Even the pyrometer, which is low in response speed, is capable of measuring the radiant energy from the semiconductor wafer W heated uniformly with stability by the hot plate 71. As in the first preferred embodiment, the temperature of the semiconductor wafer W is precisely controlled to a predetermined temperature by adjusting the temperature of the hot plate 71 based on the results of temperature measurements with the sensors 710. It is preferred that the measurements for the acquisition of the table 32 are conducted using a dummy wafer and the like.

The photodiode 21 and the pyrometer receive the radiant light emitted from the surface of the same semiconductor wafer W heated by the holder 7 to make the measurements. Thus, bringing both results of measurements into correspondence with each other allows the production of the table 32. For example, both the photodiode 21 and the pyrometer receive the radiant light emitted from the surface of the semiconductor wafer W heated to 600° C. by the holder 7, and the value of the radiant energy measured with the pyrometer is brought into correspondence with the output value from the photodiode 21. Similar correspondences are established at other temperatures. This provides the table 32 showing a correlation between the radiant energy per unit time from the semiconductor wafer W and the output from the photodiode 21 as in the first preferred embodiment shown in FIG. 9. It is preferred that the pyrometer is removed when the heat treatment of the semiconductor wafer W to be treated is performed after the completion of the acquisition of the table 32.

Although flashes of light are controlled based on the surface temperature $T_W$ of the semiconductor wafer W determined by the temperature determining part 34 in the first preferred embodiment, the emission of light from the flash lamps FL is controlled based on the radiant energy $E_W$ per unit time from the semiconductor wafer W determined by the energy calculating part 33 in the second preferred embodiment. Specifically, in Step S6 of FIG. 8, a determination is made as to whether the radiant energy $E_W$ per unit time from the semiconductor wafer W determined by the energy calculating part 33 has reached a previously set predetermined value or not. When the radiant energy $E_W$ reaches the predetermined value, the IGBT controller 98 turns OFF the IGBT 96 to interrupt the current flowing from the capacitor 93 to each flash lamp FL under the control of the controller 3.

The remaining parts of the second preferred embodiment are similar to those of the first preferred embodiment. The second preferred embodiment establishes correspondences between the radiant energy from a semiconductor wafer W determined by actual measurement with the pyrometer and the actually measured result of the output from the photodiode 21 to thereby acquire the table 32 showing the correlation therebetween. Then, when semiconductor wafer W to be treated is irradiated with flashes of light from the flash lamps FL, the photodiode 21 receives the radiant light emitted from the semiconductor wafer W. Based on the acquired table 32, the controller 3 determines the radiant energy emitted from the semiconductor wafer W irradiated with flashes of light from the output from the photodiode 21. The controller 3 further determines the surface temperature of the semiconductor wafer W from the determined radiant energy.

In this manner, the table 32 showing the correlation between the radiant energy from the semiconductor wafer W and the output from the photodiode 21 is previously acquired, and the radiant energy is determined during the irradiation with flashes of light by checking the output from the photodiode 21 extremely short in response time against the table 32. Thus, the radiant energy from the semiconductor wafer W during the irradiation with flashes of light is determined in real time. As a result, the heat treatment apparatus 1 according to the second preferred embodiment is capable of making real-time measurements of the surface temperature of the semiconductor wafer W during the irradiation with flashes of light.

Also, the capability to determine the radiant energy from the semiconductor wafer W during the irradiation with flashes of light in real time allows the control over the emission of light from the flash lamps FL based on the results of the measurements.

<Modifications>

While the preferred embodiments according to the present invention have been described hereinabove, various modifications of the present invention in addition to those described above may be made without departing from the scope and spirit of the invention. For example, flashes of light are controlled based on the surface temperature $T_W$ of a semiconductor wafer W and the radiant energy $E_W$ therefrom in the first and second preferred embodiments. However, the emission of light from the flash lamps FL may be controlled based on the total radiant energy emitted from the surface of the semiconductor wafer W. Specifically, the total radiant energy is determined by the successive integration of the radiant energy $E_W$ per unit time from the semiconductor wafer W determined by the energy calculating part 33 over the elapsed time since the start of the irradiation with flashes of light. Then, in Step S6 of FIG. 8, a determination is made as to whether the total radiant energy has reached a previously set predetermined value or not. When the total radiant energy reaches the predetermined value, the IGBT controller 98 turns OFF the IGBT 96 to interrupt the current flowing from the capacitor 93 to each flash lamp FL under the control of the controller 3.

In the first preferred embodiment, the emission of light from the flash lamps FL may be controlled based on the radiant energy $E_w$ from a semiconductor wafer W as in the second preferred embodiment. In the second preferred embodiment, the emission of light from the flash lamps FL may be controlled based on the surface temperature $T_W$ of a semiconductor wafer W as in the first preferred embodiment.

In the preferred embodiments described above, the photodiode 21 receives infrared light having a wavelength of 3 μm emitted from a semiconductor wafer W during the irradiation with flashes of light to make measurements. The wavelength used for the measurements, however, is not limited to 3 μm, but may be a wavelength of not less than 3 μm and not included in the flashes of light from the xenon flash lamps FL. The wavelength of light received by the photodiode 21 is adjustable by setting the range of wavelengths that the interference filter 22 transmits. When the radiant light received by the photodiode 21 for the measurements has a wavelength of not less than 3 μm, the flashes of light are prevented from serving as disturbance light.

Alternatively, a filter for removing light having a wavelength of not less than 3 μm from the flashes of light emitted from the flash lamps FL may be attached to the chamber window 61. This prevents the flashes of light from serving as disturbance light with reliability.

The theoretical values of the radiant energy from a semiconductor wafer W are calculated at temperatures in increments of 10° C. from 500° C. using Equation (1) in the first preferred embodiment, but may be calculated at any temperature interval from any temperature. It should be noted, however, that the actual measurement of the output from the photodiode 21 for the acquisition of the table 32 is required to be conducted under the same conditions as those for the calculation of the theoretical values of the radiant energy.

The energy calculating part 33 and the temperature determining part 34 may be implemented using the one-chip microcomputer 26. In particular, for high-speed determination of the radiant energy from a semiconductor wafer W and the surface temperature thereof during the irradiation with flashes of light, it is preferred that the energy calculating part 33 and the temperature determining part 34 are implemented in the one-chip microcomputer 26 suitable for high-speed execution of a previously programmed specific process. Additionally, the IGBT controller 98 may be incorporated also in the one-chip microcomputer 26.

In the preferred embodiments described above, the IGBT 96 is incorporated in the driving circuit for each of the flash lamps FL so as to be able to interrupt the current flowing through each flash lamp FL. However, the technique according to the present invention may be applied to a driving circuit in which the IGBT 96 is not incorporated to determine the radiant energy from a semiconductor wafer W and the surface temperature thereof during the irradiation with flashes of light in real time. Of course, when the IGBT 96 is not incorporated in the driving circuit, the emission of light from the flash lamps FL cannot be controlled based on the results of measurements.

Although the IGBT 96 is used as a switching element in the preferred embodiments described above, another transistor capable of turning ON and OFF the circuit in accordance with a signal level inputted to the gate thereof may be used in place of the IGBT 96. It is, however, preferable to use an IGBT or a GTO (gate turn-off) thyristor which are suitable for handling high power because the emission of light from the flash lamps FL consumes considerably high power.

Also, the IGBT controller 98 may output a pulse signal including a plurality of pulses to the gate of the IGBT 96 during the irradiation with flashes of light to turn ON and OFF the IGBT 96, so that the current flowing to each of the flash lamps FL is chopper-controlled.

Although the 30 flash lamps FL are provided in the lamp house 5 according to the above-mentioned preferred embodiments, the present invention is not limited to this. Any number of flash lamps FL may be provided. The flash lamps FL are not limited to the xenon flash lamps, but may be krypton flash lamps. Further, the light source serving as a heating source is not limited to the flash lamps, but other types of lamps may be used, in which case the technique according to the present invention is applicable to achieve the determination of the temperature of a semiconductor wafer W.

Also, in the aforementioned preferred embodiments, a semiconductor wafer W is preheated by placing the semiconductor wafer W on the hot plate 71. The technique for preheating is not limited to this, but a halogen lamp may be provided to emit light toward a semiconductor wafer W, thereby preheating the semiconductor wafer W up to the preheating temperature T1. It is, however, preferred that light shielding is provided to a light path from the halogen lamp to the photodiode 21 to prevent the light emitted from the halogen lamp from serving as disturbance light during the irradiation with flashes of light.

Moreover, a substrate to be treated or processed by the heat treatment technique according to the present invention is not limited to a semiconductor wafer, but may be a glass substrate for use in a liquid crystal display apparatus, and a substrate for a solar cell. Also, the technique according to the present invention may be applied to the joining of metal and silicon, and to the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A method of heating a substrate by irradiating the substrate with flashes of light, comprising the steps of:
    (a) acquiring a table showing a correlation between radiant energy per unit time from a substrate and an output from a photodiode receiving radiant light emitted from the substrate, said table showing a correlation between radiant energy per unit time from the substrate measured with a pyrometer and an output from said photodiode;
    (b) irradiating the substrate with flashes of light from a flash lamp;
    (c) determining, from the output from said photodiode, the radiant energy emitted per unit time from the substrate irradiated with flashes of light, based on said table; and
    (d) determining the surface temperature of the substrate from the radiant energy per unit time from the substrate determined in said step (c).

* * * * *